US012796486B2

(12) United States Patent
Liang et al.

(10) Patent No.: US 12,796,486 B2
(45) Date of Patent: Nov. 10, 2026

(54) SEMICONDUCTOR PACKAGE, PACKAGE FORMING METHOD, AND POWER SUPPLY MODULE

(71) Applicant: SHENZHEN STS MICROELECTRONICS CO., LTD., Shenzhen (CN)

(72) Inventors: Lin Liang, Shenzhen (CN); Qiao Chen, Shenzhen (CN); Junjie Qiu, Shenzhen (CN); Yi Ming Liang, Shenzhen (CN)

(73) Assignee: SHENZHEN STS MICROELECTRONICS CO., LTD., Shenzhen (CN)

( * ) Notice: Subject to any disclaimer, the term of this patent is extended or adjusted under 35 U.S.C. 154(b) by 410 days.

(21) Appl. No.: 18/532,950

(22) Filed: Dec. 7, 2023

(65) Prior Publication Data

US 2024/0203843 A1 Jun. 20, 2024

(30) Foreign Application Priority Data

Dec. 15, 2022 (CN) ........................ 202211615626.4

(51) Int. Cl.
*H10W 70/40* (2026.01)
*H10W 90/00* (2026.01)

(52) U.S. Cl.
CPC ....... *H10W 70/461* (2026.01); *H10W 70/467* (2026.01); *H10W 90/00* (2026.01);
(Continued)

(58) Field of Classification Search
CPC .................................................. H10W 90/291
See application file for complete search history.

(56) References Cited

U.S. PATENT DOCUMENTS 8,987,876 B2 3/2015 Gowda et al.
9,107,290 B1 8/2015 Chen
(Continued)

*Primary Examiner* — Benjamin P Sandvik
(74) *Attorney, Agent, or Firm* — Seed IP Law Group LLP

(57) ABSTRACT

A semiconductor package is provided, including a package forming method and a power supply module. The semiconductor package may include a first chip comprising a first surface, and a second surface opposite the first surface. The semiconductor package may also include a chip interconnect component located on the second surface of the first chip. In addition, the semiconductor package may include a second chip located on the chip interconnect component, comprising a third surface in contact with the chip interconnect component, and a fourth surface opposite the third surface. The chip interconnect component comprises an electrically conductive frame, one side of the electrically conductive frame is electrically connected to the second surface of the first chip, and the other side of the electrically conductive frame is electrically connected to the third surface of the second chip. The chip interconnect component may further comprise an insulating material for filling a gap of the electrically conductive frame between the first chip and the second chip. By arranging at least two chip on both sides of a preformed chip interconnect component, embodiments of the present disclosure achieve a high density chip layout for a 3D structure.

20 Claims, 6 Drawing Sheets

(52) U.S. Cl.
CPC ........ *H10W 90/811* (2026.01); *H10W 90/723* (2026.01); *H10W 90/724* (2026.01); *H10W 90/734* (2026.01); *H10W 90/736* (2026.01)

(56) References Cited

U.S. PATENT DOCUMENTS

| | | | | |
|---|---|---|---|---|
| 2013/0010446 | A1 | 1/2013 | Henrik et al. | |
| 2019/0131275 | A1 | 5/2019 | Liao et al. | |
| 2021/0151417 | A1* | 5/2021 | Strogies | H10W 40/00 |
| 2021/0210472 | A1* | 7/2021 | Ji | H02M 3/003 |
| 2021/0225730 | A1* | 7/2021 | Tolentino | H10W 40/255 |
| 2021/0398884 | A1* | 12/2021 | Nasu | H10W 70/467 |
| 2022/0302084 | A1 | 9/2022 | Nishiwaki | |
| 2022/0352137 | A1* | 11/2022 | Wang | H10W 90/00 |
| 2022/0359336 | A1* | 11/2022 | Kobayashi | H10W 40/10 |
| 2024/0304603 | A1* | 9/2024 | Zhou | H10D 12/441 |

* cited by examiner

SEMICONDUCTOR PACKAGE, PACKAGE FORMING METHOD, AND POWER SUPPLY MODULE

BACKGROUND

Technical Field

Embodiments of the present disclosure relate to the field of semiconductors, and specifically, to a semiconductor package, a package forming method, and a power supply module comprising the semiconductor package.

Description of the Related Art

With the development of high density and miniaturization of electronic products, there is a growing tendency for high integration, thinness, and miniaturization. In order to meet the design requirements of miniaturization and high integration of modern electronic products, printed circuit boards are typically designed to be small in size. However, with popularization of high-power semiconductor chips, how to shrink the package volume of the semiconductor chip as much as possible while maintaining a stable heat dissipation performance is the current problem to be solved. The trade-off between the thermal performance and miniaturization restricts the development of power devices towards higher integration and higher power density.

In the legacy heat dissipation solution, a single or a dual side heat dissipation solution is commonly employed, where power semiconductor chip(s) is placed on an insulating substrate having a thermally conductive property (e.g., DBC, AMB, IMS, and the like) to directly transfer heat generated by the power semiconductor chip(s) out of the package surface, thus implementing heat dissipation for the power semiconductor chips. However, the legacy heat dissipation solution still has the disadvantages of a low chip density, a high thermal resistance, uneven thermal conduction paths, a complicated assembling process, and the like.

BRIEF SUMMARY

According to example embodiments of the present disclosure, there is provided a new dual side heat dissipation solution.

In a first aspect of the present disclosure, there is provided a semiconductor package. The semiconductor package may include a first chip comprising a first surface, and a second surface opposite the first surface. The semiconductor package may also include a chip interconnect component located on the second surface of the first chip. In addition, the semiconductor package may include a second chip located on the chip interconnect component, comprising a third surface in contact with the chip interconnect component, and a fourth surface opposite the third surface. The chip interconnect component comprises an electrically conductive frame, one side of the electrically conductive frame is electrically connected to the second surface of the first chip, and the other side of the electrically conductive frame is electrically connected to the third surface of the second chip. The chip interconnect component further comprises an insulating material for filling a gap of the electrically conductive frame between the first chip and the second chip.

In a second aspect of the present disclosure, there is provided a package forming method. The method may include: forming a first chip on a first substrate component, the first chip comprising a first surface in contact with the first substrate component, and a second surface opposite the first surface; forming a chip interconnect component on the first substrate component and the second surface of the first chip; forming a second chip on the chip interconnect component, the second chip comprising a third surface in contact with the chip interconnect component, and a fourth surface opposite the third surface; and forming a second substrate component on the fourth surface of the second chip, wherein the chip interconnect component is preformed to comprise: an electrically conductive frame, one side of the electrically conductive frame being electrically connected to the second surface of the first chip, and the other side of the electrically conductive frame being electrically connected to the third surface of the second chip; and an insulating material for filling a gap of the electrically conductive frame between the first chip and the second chip.

In a third aspect of the present disclosure, there is provided a power supply module, comprising: at least two semiconductor packages as described in the first aspect of the present disclosure.

This Summary is provided to introduce a selection of concepts in a simplified form that are further described below in the Detailed Description. It would be appreciated that this Summary is not intended to identify key features or essential features of the present disclosure as described herein, nor is it intended to be used to limit the scope of the present disclosure. Other features of the present disclosure will become evident through the following description.

BRIEF DESCRIPTION OF THE SEVERAL VIEWS OF THE DRAWINGS

The above and other features, advantages, and aspects of embodiments of the present disclosure will become more apparent, through the following detailed description with reference to the accompanying drawings. Throughout the drawings, the same or similar reference symbols refer to the same or similar components, wherein.

DETAILED DESCRIPTION

Figure 1:
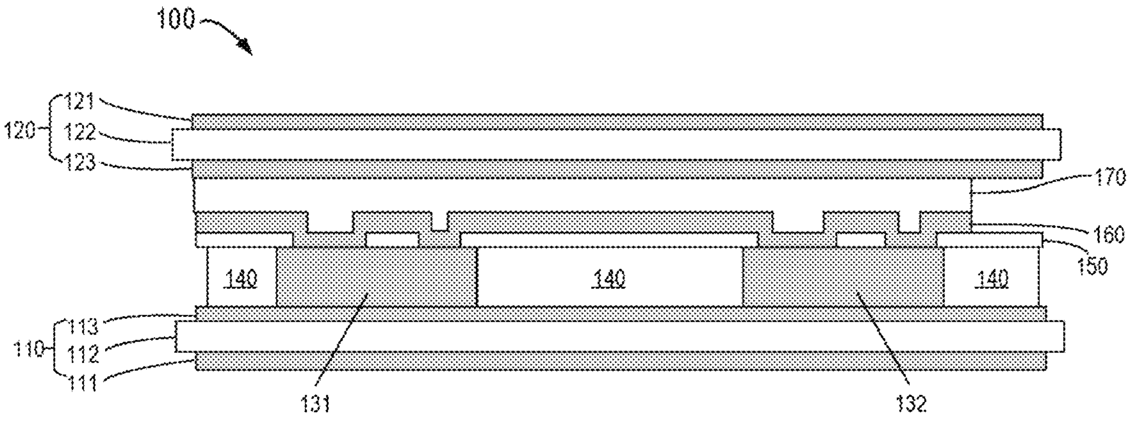
FIG. 1 illustrates a schematic diagram of a legacy semiconductor package based on a dual side heat dissipation solution.

Reference now will be made to the drawings to describe in detail embodiments of the present disclosure. Although some embodiments of the present disclosure are depicted in the drawings, it would be appreciated that the present disclosure could be implemented in various forms, and should not be construed as being limited to those embodiments described herein. Rather, those embodiments are provided to enable those skilled in the art to understand the present disclosure more thoroughly and completely. It is to be understood that the drawings and embodiments of the present disclosure are only provided exemplarily, without suggesting any limitation to the protection scope of the present disclosure.

In the description of the embodiments of the present disclosure, the term "includes" and its variants are to be read as open terms that mean "includes, but is not limited to." The term "based on" is to be read as "based at least in part on." The term "an embodiment" or "the embodiment" is to be read as "at least one embodiment." The terms "first," "second," and the like, may refer to different or the same objects. Other definitions, explicit or implicit, may be covered hereinafter.

The directional terms (e.g., "top," "bottom," "upper," "lower," "front," "rear," "head," "tail," "above," "under," and the like) may be used with reference to directions of the drawings and/or elements described herein. As positioning can be implemented in various directions in the embodiments, the directional terms are used for illustration, without limitation. In some embodiments, as long as general directional relationships between elements and general purposes thereof are retained, the directional terms can be replaced by equivalents thereof based on the orientations of the embodiments.

As used herein, the expressions with serial numbers (e.g., "first," "second," and the like) may be used to modify various elements. However, those elements are not restricted to those expressions. For example, the expressions do not define a sequence and/or importance of elements. Those expressions are only used to differentiate one element from a further one.

It would be appreciated that, when an element is described as being "connected" or "coupled" to a further element, it may be connected or coupled to the further element directly, or there may be a middle element. In turn, when an element is described as being "directly connected" or "directly coupled" to a further element, there is no middle element. Other expressions for describing relationships between elements are to be read likewise (e.g., "between" and "directly between," "adjacent" and "directly adjacent," and the like).

In the embodiments described herein or shown in the drawings, any direct electrical connection or coupling (i.e., any connection or coupling, without an additional middle element) can be implemented through indirect connection or coupling (i.e., connection or coupling to one or more additional middle elements), or vice versa, as long as the general purpose of substantially maintaining the connection or coupling is accomplished.

As described above, with the development of semiconductor technology, the design of electronic devices shows a trend of miniaturization. How to integrate more chips per unit of area or volume, and how to provide an efficient and balanced cooling performance are prerequisites to ensure high integration and high stability of miniaturized electronic devices.

The heat dissipation solution is typically divided into a single side heat dissipation solution and a dual side heat dissipation solution. As the dual side heat dissipation solution generally exhibits a better heat dissipation performance, the power semiconductor chip package design based on dual side heat dissipation solution is preferably employed.

FIG. 1 illustrates a schematic diagram of a legacy semiconductor package 100 based on a dual side heat dissipation solution. As shown in FIG. 1, the semiconductor package 100 includes an insulating substrate 110, a chip 131, a chip 132, an epoxy resin 140 filled in a gap between the chips, and an insulating substrate 120. The insulating substrate 110 may be DBC (Direct Bonding Copper), which may include a copper layer 111, a ceramic layer 112, and a copper layer 113. The DBC has characteristics of ceramics, including high thermal conductivity, high electrical insulation, high mechanical strength, and low expansion of ceramics, etc., as well as characteristics of oxygen-free copper, including high electrical conductivity and excellent welding performance. The chips 131, 132 may be joined to the copper layer 113 via a welding material (not shown). In this way, the heat generated by operation of the chips 131, 132 may be transferred to the lower part of the semiconductor package 100, for convenience of dissipation to the external or other component.

In addition, the semiconductor package 100 introduces a polyimide layer 150, a copper layer 160, and a thermal interface material layer 170 onto upper surfaces of the chips 131, 132, to further optimize thermal conductivity and provide design-based electrical connections. Further, the insulating substrate 120 is arranged above the semiconductor package 100. The insulating substrate 120 may be DBC (Direct Bounding Copper), which may include a copper layer 121, a ceramic layer 122, and a copper layer 123. In this way, the heat generated by operation of the chips 131, 132 may be transferred to the upper part of the semiconductor package 100, for convenience of dissipation to the external or other component.

However, the legacy dual side heat dissipation solution has the following problems. First, as the legacy dual side heat dissipation solution only provides the possibility of single side chip heat dissipation, the multi-chip package has the disadvantages of low density, too large volume, and the like. Second, since the copper layer 160 and the heat interface material layer 170 are arranged at the upper side of the chips 131, 132, the thermal resistance of the upward thermal conduction path of the chips 131, 132 is not balanced with the thermal resistance of the downward thermal conduction path of the chips 131, 132. In addition, the entire structure and the forming process of the semiconductor package 100 become more complicated due to a large number of assembled components that cause a difficulty in controlling the package flatness and prolong the assembling process. In the case, there is a need for improving the legacy dual side heat dissipation solution, to overcome or at least mitigate at least one of the deficiencies mentioned above.

According to embodiments of the present disclosure, there is provided a package forming solution. By providing a chip interconnect component with thermal and electrical conductivity properties and arranging at least two chips respectively on two sides of the chip interconnect component, the solution can solve the above-mentioned problem and/or other potential problems. Hereinafter, reference will be made to the above example scenario to describe in detail the respective embodiments of the present disclosure. It would be appreciated that the description thereon is provided only for illustration, without suggesting any limitation to the scope of the present disclosure.

Figure 2:
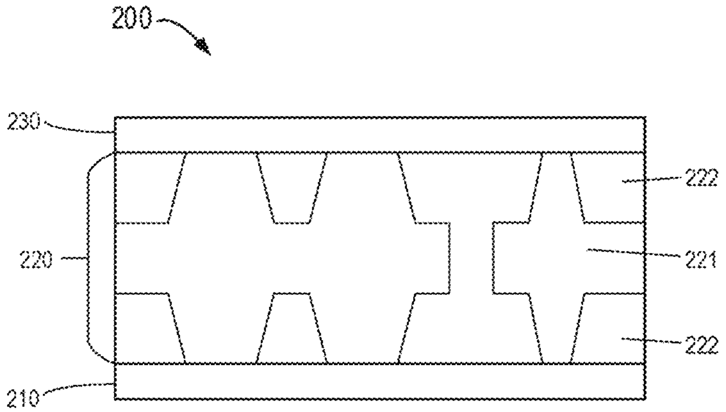
FIG. 2 illustrates a schematic diagram of a semiconductor package according to an embodiment of the present disclosure.

FIG. 2 illustrates a schematic diagram of a semiconductor package 200 according to an embodiment of the present disclosure. It would be appreciated that the semiconductor package 200 as shown in FIG. 2 is only an example where the embodiment of the present disclosure can be implemented, without limiting the scope of the present disclosure.

As shown in FIG. 2, the semiconductor package 200 may include a first chip 210. For example, the first chip 210 may include a first surface, for example, a lower surface, and a second surface opposite the first surface, for example, an upper surface. For another example, the first chip 210 may be a bare chip or die. Correspondingly, the semiconductor package 200 may further include a second chip 230. For example, the second chip 230 may include a third surface, for example, a lower surface, and a fourth surface opposite the third surface, for example, an upper surface. For another example, the second chip 230 may be a bare chip or die. It would be appreciated that, in addition to the first chip 210 and the second chip 230 as shown in FIG. 2, the semiconductor package 200 may further include one or more other chips.

In addition, the semiconductor package 200 may further include a chip interconnect component 220. As shown in FIG. 2, the chip interconnect component 220 is located between the first chip 210 and the second chip 230. Specifically, the chip interconnect component 220 may be disposed on the second surface of the first chip 210 and below the third surface of the second chip 230. As shown in FIG. 2, the chip interconnect component 220 may include an electrically conductive frame 221. One side of the electrically conductive frame 221 is electrically connected to the second surface of the first chip 210, and the other side of the electrically conductive frame 221 is electrically connected to the third surface of the second chip 230. It would be appreciated that the electrically conductive frame 221 may be patterned to be the structure in FIG. 2 or other structure based on the circuit layout. In this way, by arranging at least two chips on two sides of the chip interconnect component 220, the embodiment can increase the number of chips per unit of area while implementing dual side heat dissipation, so as to attain a high density chip arrangement.

It is to be understood that, in an application scenario such as a power transistor, the first chip 210 may be a first power transistor, the second chip 230 may be a second power transistor, and the gate of the first power transistor (i.e., the right portion of the first chip 210 in FIG. 2) and the gate of the second power transistor (i.e., the right portion of the second chip 230 in FIG. 2) are electrically connected via a first electrically conductive pillar of the electrically conductive frame 221 (i.e., the right portion of the electrically conductive frame 221 in FIG. 2). Correspondingly, the source of the first power transistor (i.e., the left portion of the first chip 210 in FIG. 2) and the source of the second power transistor (i.e., the left portion of the second chip 230 in FIG. 2) are electrically connected via at least one second electrically conductive pillar of the electrically conductive frame 221 (i.e., the left portion of the electrically conductive frame 221 in FIG. 2). Correspondingly, the drain of the first power transistor (i.e., the first surface of the first chip 210 in FIG. 2) and the drain of the second power transistor (i.e., the fourth surface of the second chip 230 in FIG. 2) are electrically connected via a further external conductor. Therefore, a parallel structure of multiple power transistors may be formed to thus achieve fast and reliable high-current or high-power driving. It would be appreciated that, compared with the legacy process of wiring of, for example, the gate of each power transistor, the electrically conductive frame 221 may provide an electrical connection between at least two chips, so as to save the external wiring space and improve the reliability of electrical connections.

Moreover, the chip interconnect component 220 may further include an insulating material 222. The insulating material 222 is arranged to fill the gap of the electrically conductive frame 221 between the first chip 210 and the second chip 230. It would be appreciated that the chip interconnect assembly 220 may be preformed or premolded. For example, the copper material may be patterned to be the electrically conductive frame 221, and the patterned electrically conductive frame 221 may be placed in a mold having a predetermined shape for receiving the insulating material 222, for example, polyimide in a liquid state. After the insulating material 222 is solidified, the chip interconnect component 220 can be formed.

It is to be understood that the laminated chip arrangement as shown in FIG. 2 is not limited to a symmetrical arrangement. By way of example, the first chip 210 may have a different size than the second chip 230; the connection position between the first chip 210 and the electrically conductive frame 221 may be different from the one between the second chip 230 and the electrically conductive frame 221; and even the position, shape and size of the electrically conductive pillar of the electrically conductive frame 221 connected to the first chip 210 are different from the position, shape and size of the electrically conductive pillar of the electrically conductive frame 221 connected to the second chip 230. In other words, for adaption to respective packages of different types of chips, the chip interconnect component 220, such as the electrically conductive frame 221 therein, may be designed as having a particular shape.

In some embodiments, the electrically conductive frame 221 may include at least one of copper, silver, aluminum, solder, and the like.

In some embodiments, the insulating material 221 may be at least one of polyimide, polymethacrylimide, epoxy resin, and the like.

In some embodiments, the semiconductor package 200 may include a plurality of pairs of chips, for example, 2N chips located on both sides of the chip interconnect component, where N is a natural number. Alternatively or additionally, the semiconductor package 200 may further include 2N+1 chips as required particularly. At this time, a third chip not paired with other chips may be electrically connected to the electrically conductive frame 221 of the chip interconnect component 220, and located on the same side as the first chip 210 or the second chip 230. It is to be understood that the third chip may be subject to the same packaging method and the same heat conduction method as the first chip 210 or the second chip 230.

Figure 3:
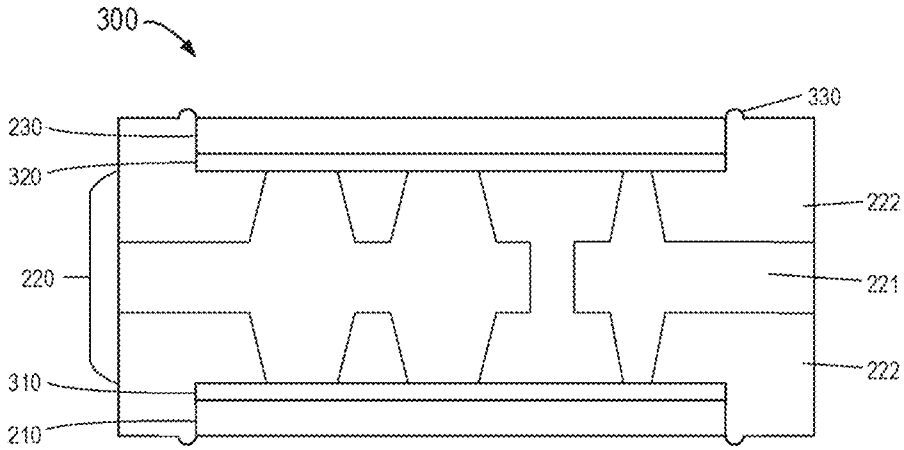
FIG. 3 illustrates a schematic diagram of a semiconductor package according to a further embodiment of the present disclosure.

In some embodiments, the insulating material 222 may be formed to include recesses each having a predetermined dimension for limiting the positions of the first chip 210 and the second chip 230, and may be formed to include one or more positioning members, so as to limit the position of the substrate component for further heat dissipation. FIG. 3 illustrates a schematic diagram of a semiconductor package 300 according to a further embodiment of the present disclosure.

FIG. 3 is similar to FIG. 2, and the differences therebetween lie in: a first sintered layer 310 is arranged between the first chip 210 and the chip interconnect component 220, to cause the first chip 210 to be in electrical contact with the electrically conductive frame 221; and a second sintered layer 320 is arranged between the second chip 230 and the chip interconnect component 220, to cause the second chip 230 to be in electrical contact with the electrically conductive frame 221. In other words, a sintering process may be used to arrange the first chip 210 and the second chip 230 on both sides of the chip interconnect component 220, respectively. As an example, by sintering a sinter paste containing metal particles, with electrical and thermal conductivity properties, a dense sintered layer may be formed between the first chip 210 and the chip interconnect component 220, and between the second chip 230 and the chip interconnect component 220, so as to establish electrical and thermal conductive paths and efficiently shorten the time spent on the interconnect process.

In some embodiments, the sintering process as mentioned above may be a wet sintering process. By way of example, the wet sintering process includes: applying a sintering paste of a Bingham fluid at a connection position, to form a sintering paste layer having a uniform thickness, for example, various Bingham-fluid sintering pastes containing gold, silver or copper particles with good thermal and electrical conductivity properties. In addition, the wet sintering process further includes: positioning a connection position such that the connection between the chip and the chip interconnect component is supported by the sintering paste; heating it to a first temperature for a set time, to evaporate additives in the sintering paste layer; and heating it to a second temperature for a set time, such that metal particles in the sintering paste layer are bounded to form a sintered layer at the interconnect position. It would be appreciated that, since the sintering paste of Bingham-fluid is used, the shear force it receives will not cause shear deformation when is does not reach the critical shear stress. Thus, the sintering paste layer coated with the sintering paste of Bingham-fluid with a selected proper mechanical property may generate an effective support between the chip and the chip interconnect component. The shape of the sintering paste layer is controllable, which will not be deformed as being subject to a force less than its extreme shear force.

In addition, as stated above, the insulating material 222 may be formed to include one or more positioning members, for example, positioning members 330, to position the substrate component to be packaged thereafter. It is to be understood that the shape of the positioning member 330 is not limited to a semicircular protrusion as shown in FIG. 3, which may be shaped in other forms, for example, a triangular recess or the like. It would be further appreciated that the sintered layer described herein may include all electrically conductive soldering materials (silver, copper, solder, and the like).

Figure 4:
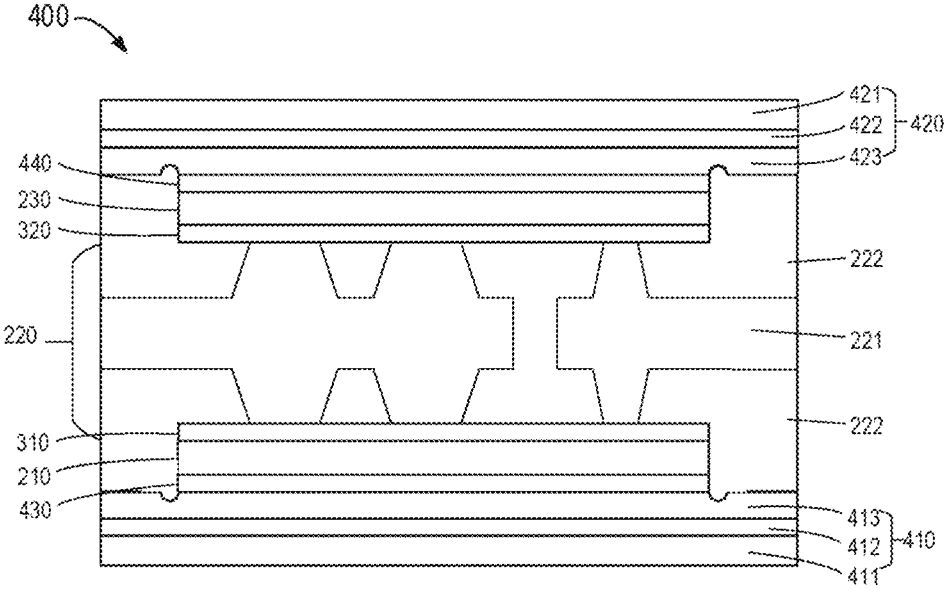
FIG. 4 illustrates a schematic diagram of a semiconductor package based on a dual side heat dissipation solution according to embodiments of the present disclosure.

FIG. 4 further illustrates a schematic diagram of a semiconductor package 400 based on a dual side heat dissipation solution according to embodiments of the present disclosure. FIG. 4 is similar to FIG. 3, and the differences therebetween lie in: the semiconductor package 400 further includes a first substrate component 410 and a second substrate component 420, where the first substrate component 410 is in contact with the first chip 210 via a third sintered layer 430, and the second substrate component 420 is in contact with the second chip 230 via a fourth sintered layer 440. It would be appreciated that the first substrate component 410 is used to transfer heat from the first surface of the first chip 210, and the second substrate component 420 is used to transfer heat from the fourth surface of the second chip 230. Moreover, the electrically conductive frame 221 is used to transfer heat from the second surface of the first chip 210 and heat from the third surface of the second chip 230. In this way, a 3D stacked structure sequentially including a substrate component, a chip, a chip interconnect component, a chip, and a substrate component can be formed, so as to reduce the overall size of the package while increasing the chip density.

In some embodiments, the first substrate component 410 and the second substrate component 420 each may be an AMB (Active Metal Brazing) plate. As shown in FIG. 4, the first substrate component 410 may include a copper layer 411, a ceramic layer 412, and a cooper layer 413, and the second substrate component 420 may include a copper layer 421, a ceramic layer 422, and a copper layer 423. It would be appreciated that the copper in the above embodiments may be replaced by other thermally and electrically conductive materials, and the ceramic in the above embodiments may be replaced by other thermally conductive and electrically insulating materials.

In some embodiments, the copper layer 413 in the first substrate component 410 may include two positioning members which match the pre-formed positioning members 330 on the insulating material 222, so as to implement accurate positioning. In addition, the copper layer 423 in the second substrate component 420 may similarly include two positioning members which match the pre-formed positioning members on the insulating material 222.

The technical solution described above is provided only as an example, without limiting the present disclosure. It is to be understood that the whole semiconductor package may be arranged in other methods and according to other connection relationships. In order to make the principle of the above solution more clearly, reference will be made to FIG. 5 to describe below in detail the process of forming a semiconductor package according to embodiments of the present disclosure. Besides, reference will also be made to FIGS. 6A-6D to describe in detail respective stages of the process of forming a semiconductor package.

Figure 5:
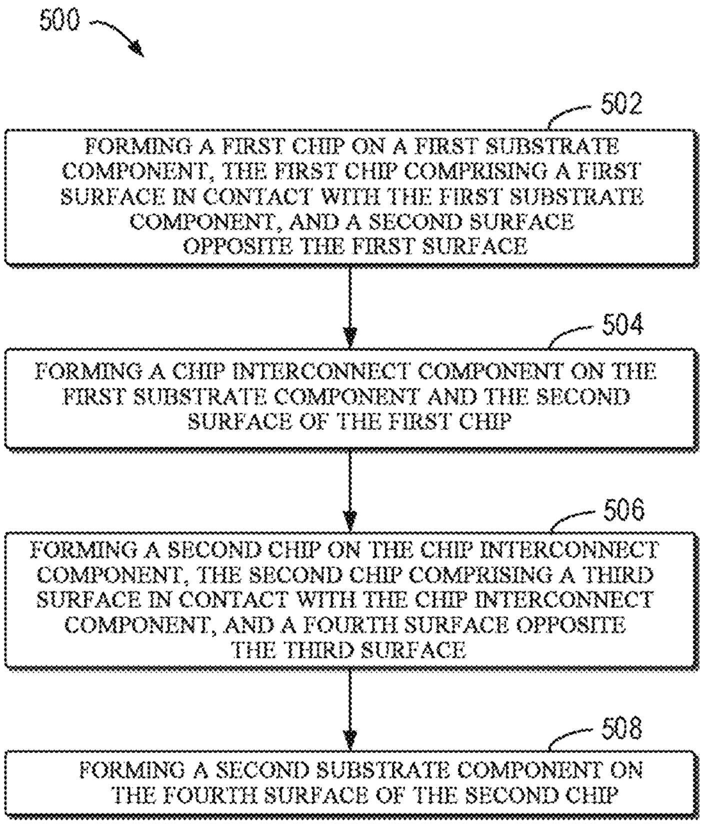
FIG. 5 illustrates a flowchart of a process of forming a semiconductor package according to embodiments of the present disclosure.

FIG. 5 illustrates a flowchart of a process 500 of forming a semiconductor package according to embodiments of the present disclosure. FIGS. 6A-6D illustrate a schematic diagram of respective stages of forming a semiconductor package according to embodiments of the present disclosure. For ease of understanding, the specific embodiments, as will be mentioned later, are all provided exemplarily, without limiting the protection scope of the present disclosure.

Figure 6A:
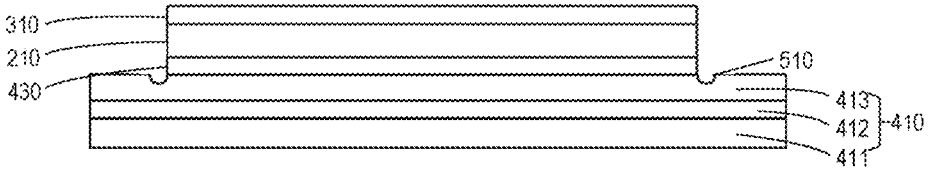
FIGS. 6A-6D illustrate schematic diagrams of respective stages of forming a semiconductor package according to embodiments of the present disclosure.
Figure 6B:
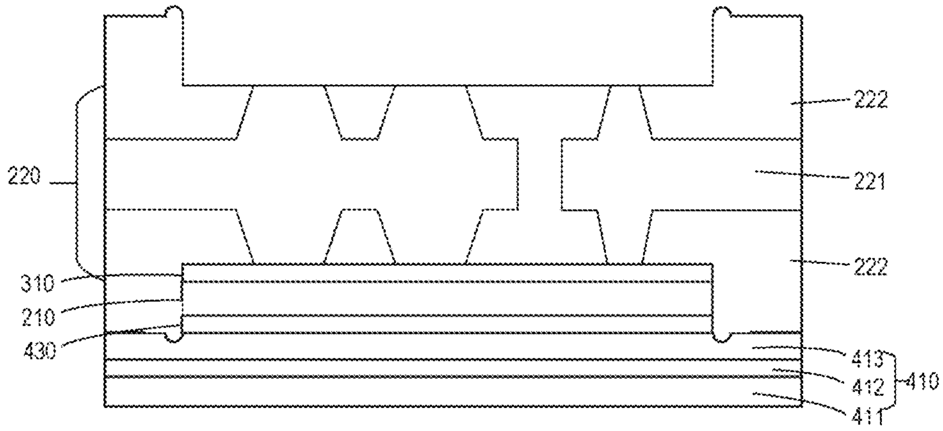

At block 502, a first chip 210 is formed on a first substrate component 410, where the first chip 210 may include a first surface in contact with the first substrate component 410, and a second surface opposite the first surface. As shown in FIG. 6A, since the first chip 210 can be arranged on the first substrate component 410 by a wet sintering process, there is a third sintered layer 430 between the first chip 210 and the first substrate component 410. Further, a first sintered layer 310 for the wet sintering process is provided on the second surface of the first chip 210. In addition, the first substrate component 410 may include a copper layer 411, a ceramic layer 412, and a copper layer 413.

At block 504, a chip interconnect component 220 is formed on the first substrate component 410 and the second surface of the first chip 210. As shown in FIG. 6A, since the chip interconnect component 220 may be arranged on the first chip 210 by the wet sintering process, there is a first sintered layer 310 between the first chip 210 and the chip interconnect component 220. Specifically, through the wet sintering process, the first chip 210 is caused to be in electrical contact with an electrically conductive pillar in the electrically conductive frame 221.

Figure 6C:
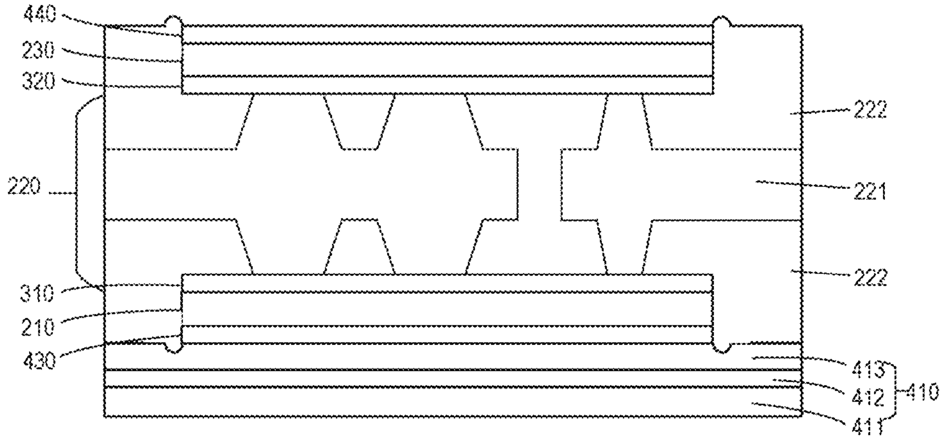

At block 506, a second chip 230 is formed on the chip interconnect component 220, where the second ship 230 includes a third surface in contact with the chip interconnect component 220, and a fourth surface opposite the third surface. As shown in FIG. 6C, since the second chip 230 is arranged on the chip interconnect component 220 by the wet sintering process, there is a second sintered layer 320 between the second chip 230 and the chip interconnect component 220. Specifically, through the wet sintering process, the second chip 230 is caused to be in electrical contact with the electrically conductive frame 221. In addition, a fourth sintered layer 440 for the wet sintering process is provided on the fourth surface of the second chip 230.

Figure 6D:
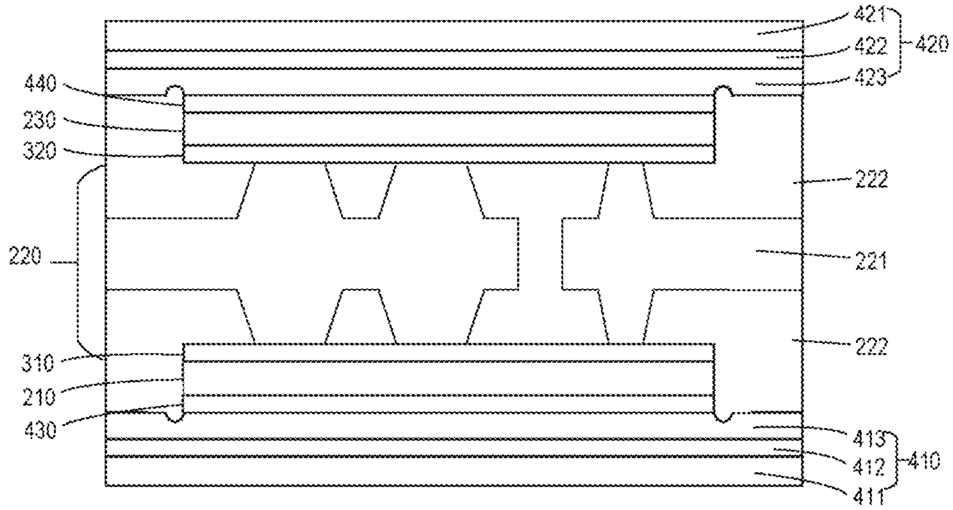

At block 508, a second substrate component 420 is formed on the fourth surface of the second chip 230. As shown in FIG. 6D, since the second substrate component 420 may be arranged on the second chip 230 by the wet sintering process, there is a fourth sintered layer 440 between the second chip 230 and the second substrate component 420. Further, the second substrate component 420 may include a copper layer 421, a ceramic layer 422, and a copper layer 423.

As mentioned in the foregoing, the chip interconnect component 220 may be preformed to include an electrically conductive frame 221 and an insulating material 222. One side of the electrically conductive frame 221 is electrically connected to the second surface of the first chip 210, and the other side of the electrically conductive frame 221 is electrically connected to the third surface of the second chip 230. In addition, the insulating material 222 is used to fill a gap of the electrically conductive frame 221 between the first chip 210 and the second chip 230.

It would be appreciated that, the process of manufacturing the chip interconnect component 220, and the process of manufacturing the first substrate component 410 and the second substrate component 420 may be completed at suppliers, and the processes, as stated above, may be implemented in any reasonable sequence or in parallel.

In some embodiments, the first substrate component 410 is used to transfer heat from the first surface of the first chip, the second substrate component 420 is used to transfer heat from the fourth surface of the second chip 230, and the electrically conductive frame 221 is used to transfer heat from the second surface of the first chip 210 and heat from the third surface of the second chip 230.

In some embodiments, as shown in FIGS. 6A-6D, the first substrate component 410 is formed to include at least one positioning member 510 that matches a corresponding positioning member preformed on the insulation material 222. Likewise, the second substrate component 420 is formed to include at least one positioning member that matches a corresponding positioning member preformed on the insulating material 222. It would be appreciated that the shape of the formed positioning member 510 is not limited to a semicircular recess as shown in FIG. 6A, which may also be a square protrusion, and the like.

In some embodiments, the first chip 210 is a first power transistor, the second chip 230 is a second power transistor, and the gate of the first power transistor (i.e., the right portion of the first chip 210 in FIG. 6D) and the gate of the second power transistor (i.e., the right portion of the second chip 230 in FIG. 6D) are electrically connected via a first electrically conductive pillar of the electrically conductive frame 221 (i.e., the right portion of the electrically conductive frame 221 in FIG. 6D). Correspondingly, the source of the first power transistor (i.e., the left portion of the first chip 210 in FIG. 6D) and the source of the second power transistor (i.e., the left portion of the second chip 230 in FIG. 6D) are electrically connected via at least one second electrically conductive pillar of the electrically conductive frame 221 (i.e., the left portion of the electrically conductive frame 210 in FIG. 6D). Correspondingly, the drain of the first power transistor (i.e., the first surface of the first chip 210 in FIG. 6D) and the drain of the second power transistor (i.e., the fourth surface of the second chip 230 in FIG. 6D) are electrically connected via other external conductors. Therefore, a parallel structure of multiple power transistors may be formed, so as to achieve fast and reliable high-current or high-power driving.

In some embodiments, when the first chip 210 or the second chip 230 is formed, a third chip may further be formed. The third chip may be electrically connected to the electrically conductive frame 221 of the chip interconnect component 220. It would be appreciated that the third chip is subject to the same packaging method and the same heat conduction method as the first chip 210 or the second chip 230.

It would be appreciated that, as shown in FIG. 6A, the first substrate component 410 may be preformed. In some embodiments, the first substrate component 410 may be formed by combining the copper layer 411, the ceramic layer 412, and the copper layer 413 formed to include a positioning member 510. For example, the copper layer 411, the ceramic layer 412 and the copper layer 413 may be combined into one unit by lamination.

It is to be understood that the semiconductor package manufactured with the above process can be applied to power supply modules that require power chips, for example, electronic control units in a vehicle system. In some embodiments, the power supply module may include at least two, or even hundreds of, semiconductor packages as described above in multiple embodiments and combinations thereof.

In view of the above, by arranging at least two chips on both sides of the preformed chip interconnect component, the present disclosure may achieve a high-density chip layout for a 3D structure. Moreover, since the chips and the heat dissipation components are arranged on both sides of the chip interconnect component, the heat dissipation paths upwards and downwards from the chips are substantially balanced in heat. In addition, as the positioning members are preformed on the chip connection component and the heat dissipation component, the present disclosure may improve the packaging accuracy while simplifying the packaging process. The dual side heat dissipation solution according to the present disclosure may reduce the number of components and thus simplify the combination process.

Without prejudice to the underlying principles, the details and embodiments may vary, even significantly, with respect to what has been disclosed by way of example only, without departing from the extent of protection.

The claims form an integral part of the technical teaching provided herein in relation to the various embodiments.

The extent of protection is defined by the claims appended hereinafter.

A semiconductor package, may be summarized as including: a first chip including a first surface, and a second surface opposite the first surface; a chip interconnect component located on the second surface of the first chip; and a second chip located on the chip interconnect component, including a third surface in contact with the chip interconnect component, and a fourth surface opposite the third surface, wherein the chip interconnect component includes an electrically conductive frame, one side of the electrically conductive frame is electrically connected to the second surface of the first chip, and an other side of the electrically conductive frame is electrically connected to the third surface of the second chip, and wherein the chip interconnect component further includes an insulating material for filling a gap of the electrically conductive frame between the first chip and the second chip.

The semiconductor package may further include: a first substrate component in contact with the first surface of the first chip, for transferring heat from the first surface; and a second substrate component in contact with the fourth surface of the second chip, for transferring heat from the fourth surface, wherein the electrically conductive frame may be used to transfer heat from the second surface of the first chip and transfer heat from the third surface of the second chip.

The first substrate component may include at least a first positioning member that matches a second positioning member preformed on the insulating material.

The second substrate component may include at least a third positioning member that matches a fourth positioning member preformed on the insulation material.

The semiconductor package may further include: a first sintered layer located between the first chip and the electrically conductive frame, for causing the first chip to be in electrical contact with the electrically conductive frame; and a second sintered layer located between the second chip and the electrically conductive frame, for causing the second chip to be in electrical contact with the electrically conductive frame.

The first chip may be a first power transistor, the second chip may be a second power transistor, and a gate of the first power transistor and a gate of the second power transistor may be electrically connected via a first electrically conductive pillar of the electrically conductive frame.

A source of the first power transistor and a source of the second power transistor may be electrically connected via at least one second electrically conductive pillar of the electrically conductive frame.

The electrically conductive frame may include at least one of the following material: copper; silver; aluminum; or solder.

The insulating material may be at least one of the following: polyimide; polymethacrylimide; or epoxy resin.

The semiconductor package may further include: a third chip electrically connected to the electrically conductive frame of the chip interconnect component, located on a same side as the first chip or the second chip, wherein the first substrate component or the second substrate component may be in contact with the third chip for conducting heat from the third chip.

A package forming method, may be summarized as including: forming a first chip on a first substrate component, the first chip including a first surface in contact with the first substrate component, and a second surface opposite the first surface; forming a chip interconnect component on the first substrate component and the second surface of the first chip; forming a second chip on the chip interconnect component, the second chip including a third surface in contact with the chip interconnect component, and a fourth surface opposite the third surface; and forming a second substrate component on the fourth surface of the second chip, wherein the chip interconnect component is preformed to include: an electrically conductive frame, one side of the electrically conductive frame being electrically connected to the second surface of the first chip, and an other side of the electrically conductive frame being electrically connected to the third surface of the second chip; and an insulating material for filling a gap of the electrically conductive frame between the first chip and the second chip.

The first substrate component may be used to transfer heat from the first surface, the second substrate component may be used to transfer heat from the fourth surface, and the electrically conductive frame may be used to transfer heat from the second surface of the first chip and heat from the third surface of the second chip.

The first substrate component may be formed to include at least a first positioning member that matches a second positioning member preformed on the insulating material.

The second substrate component may be formed to include at least a third positioning member that matches a fourth positioning member preformed on the insulating material.

Forming the chip interconnect component on the second surface may include: causing the first chip to be in electrical contact with the electrically conductive frame through a wet sintering process.

Forming the second chip on the chip interconnect component may include: causing the second chip to be in electrical contact with the electrically conductive frame through a wet sintering process.

The first chip may be a first power transistor, the second chip may be a second power transistor, and a gate of the first power transistor and a gate of the second power transistor may be electrically connected via a first electrically conductive pillar of the electrically conductive frame.

A source of the first power transistor and a source of the second power transistor may be electrically connected via at least one second electrically conductive pillar of the electrically conductive frame.

The package forming method may further include: when forming the first chip or forming the second chip, further forming a third chip, the third chip being electrically connected to the electrically conductive frame of the chip interconnect component.

A power supply module, may be summarized as including: at least two semiconductor packages, wherein one of the at least two semiconductor packages may include a first chip including a first surface, and a second surface opposite the first surface; a chip interconnect component located on the second surface of the first chip; and a second chip located on the chip interconnect component, including a third surface in contact with the chip interconnect component, and a fourth surface opposite the third surface, wherein the chip interconnect component includes an electrically conductive frame, one side of the electrically conductive frame is electrically connected to the second surface of the first chip, and an other side of the electrically conductive frame is electrically connected to the third surface of the second chip, and wherein the chip interconnect component further includes an insulating material for filing a gap of the electrically conductive frame between the first chip and the second chip.

The semiconductor package may further include: a first substrate component in contact with the first surface of the first chip, for transferring heat from the first surface, and a second substrate component in contact with the fourth surface of the second chip, for transferring heat from the fourth surface, wherein the electrically conductive frame may be used to transfer heat from the second surface of the first chip and transfer heat from the third surface of the second chip.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:

a first chip having a first surface and a second surface opposite the first surface, and the first chip including a first sidewall and a second sidewall that extend from the first surface to the second surface, and the first sidewall and the second sidewall are opposite to each other;

a chip interconnect component on the second surface of the first chip; and a second chip on the chip interconnect component, the second chip including a third surface in contact with the chip interconnect component, and a fourth surface opposite the third surface, the second chip including a third sidewall and a fourth sidewall that extend from the third surface to the fourth surface, and the third sidewall and the fourth sidewall are opposite to each other, wherein the chip interconnect component includes an electrically conductive frame, a first side of the electrically conductive frame is electrically coupled to the second surface of the first chip, and a second side of the electrically conductive frame is electrically coupled to the third surface of the second chip, and wherein the chip interconnect component includes an insulating material in a gap of the electrically conductive frame between the first chip and the second chip, and the first surface of the first chip is exposed from the insulating material and the third surface of the second chip is exposed from the insulating material, wherein the insulating material further includes:

a first positioning member that protrudes outward from the first surface of the first chip and abuts the first sidewall;

a second positioning member that protrudes outward from the first surface of the first chip and abuts the second sidewall;

a third positioning member that protrudes outward from the third surface of the second chip and abuts the third sidewall; and a fourth positioning member that protrudes outward from the third surface of the second chip and abuts the fourth sidewall.

2. The semiconductor package of claim 1, further comprising:

a first substrate component in contact with the first surface of the first chip, configured to transfer heat from the first surface; and a second substrate component in contact with the fourth surface of the second chip, configured to transfer heat from the fourth surface, wherein the electrically conductive frame is configured to transfer heat from the second surface of the first chip and transfer heat from the third surface of the second chip.

3. The semiconductor package of claim 1, further comprising:

a first sintered layer between the first chip and the electrically conductive frame; and a second sintered layer between the second chip and the electrically conductive frame.

4. The semiconductor package of claim 1, wherein the first chip is a first power transistor, the second chip is a second power transistor, and a gate of the first power transistor and a gate of the second power transistor are electrically coupled via a first electrically conductive pillar of the electrically conductive frame.

5. The semiconductor package of claim 4, wherein a source of the first power transistor and a source of the second power transistor are electrically coupled via at least one second electrically conductive pillar of the electrically conductive frame.

6. The semiconductor package of claim 1, wherein the electrically conductive frame comprises at least one of copper, silver, aluminum, or solder material.

7. The semiconductor package of claim 1, wherein the insulating material is at least one of polyimide, polymethacrylimide, or epoxy resin.

8. The semiconductor package of claim 2, further comprising:

a third chip electrically coupled to the electrically conductive frame of the chip interconnect component, on a same side as the first chip or the second chip, wherein the first substrate component or the second substrate component is in contact with the third chip and is configured to conduct heat from the third chip.

9. A method, comprising:

forming a first substrate component including a first positioning recess and a second positioning recess spaced apart from the first positioning recess;

coupling a first chip to the first substrate component at a region between the first positioning recess and the second positioning recess, the first chip having a first surface in contact with the first substrate component, and a second surface opposite the first surface, and first chip includes first sidewall directly adjacent to the first positioning member and a second sidewall opposite to the first sidewall directly adjacent to the second positioning member;

forming a chip interconnect component on the first substrate component and the second surface of the first chip, the chip interconnect including:

an electrically conductive frame having a first side and a second side opposite to the first side, the first side being coupled to the second surface of the first chip; and an insulating material for filling a gap of the electrically conductive frame and covering the first chip and the first substrate component, the insulating material including a third side on the first substrate component and a fourth side opposite to the third side, the insulating material including a first positioning member at the third side in the first positioning recess, a second positioning member at the third side in the second positioning recess, a recess that extends into the fourth side of the insulating material to the second side of the electrically conductive frame;

coupling a second chip on the second side of the electrically conductive frame and the insulating material of the chip interconnect component by inserting the second chip in the recess that extends into the fourth side of the insulating material, the second chip having a third surface in contact with the second side of the electrically conductive frame of the chip interconnect component, a fourth surface opposite the third surface, a third sidewall that is directly adjacent to the third positioning member, and a fourth sidewall that is directly adjacent to the fourth positioning member; and forming a second substrate component on the fourth surface of the second chip, the second substrate component including a third positioning recess that receives the third positioning member and a fourth positioning recess that receives the fourth positioning member.

10. The method of claim 9, wherein the first substrate component is configured to transfer heat from the first surface, the second substrate component is configured to transfer heat from the fourth surface, and the electrically conductive frame is configured to transfer heat from the second surface of the first chip and heat from the third surface of the second chip.

11. The method of claim 9, wherein forming the chip interconnect component on the second surface comprises:

causing the first chip to be in electrical contact with the electrically conductive frame through a wet sintering process.

12. The method of claim 9, wherein forming the second chip on the chip interconnect component comprises:

causing the second chip to be in electrical contact with the electrically conductive frame through a wet sintering process.

13. The method of claim 9, wherein the first chip is a first power transistor, the second chip is a second power transistor, and a gate of the first power transistor and a gate of the second power transistor are electrically coupled via a first electrically conductive pillar of the electrically conductive frame.

14. The method of claim 13, wherein a source of the first power transistor and a source of the second power transistor are electrically coupled via at least one second electrically conductive pillar of the electrically conductive frame.

15. The method of claim 9, further comprising:

when forming the first chip or forming the second chip, further forming a third chip, the third chip being electrically coupled to the electrically conductive frame of the chip interconnect component.

16. A power supply module, comprising:

at least two semiconductor packages, wherein one of the at least two semiconductor packages include:

a first chip having a first surface, a second surface opposite the first surface, a first sidewall that extends from the first surface to the second surface, and a second sidewall opposite to the first sidewall that extends from the first surface to the second surface;

a chip interconnect component on the second surface of the first chip; and a second chip on the chip interconnect component, having a third surface in contact with the chip interconnect component, and a fourth surface opposite the third surface, a third sidewall that extends from the third surface to the fourth surface, and a fourth sidewall that is opposite to the third sidewall and extends from the third surface to the fourth surface;

wherein the chip interconnect component comprises an electrically conductive frame, a first side of the electrically conductive frame is electrically coupled to the second surface of the first chip, and a second side of the electrically conductive frame is electrically coupled to the third surface of the second chip; and wherein the chip interconnect component further comprises an insulating material for filing a gap of the electrically conductive frame between the first chip and the second chip, insulating material including a first positioning in close proximity to the first sidewall of the first chip, a second positioning member in close proximity to the second sidewall, a third positioning member in close proximity to the third sidewall, and a fourth positioning member in close proximity to the fourth sidewall, wherein the first and second positioning members protrude away from a first surface of the first chip and the third and fourth positioning members protrude away from the fourth surface of the second chip.

17. The power supply module of claim 16, wherein:

the one of the at least two semiconductor packages further includes:

a first substrate component in contact with the first surface of the first chip, for transferring heat from the first surface; and a second substrate component in contact with the fourth surface of the second chip, for transferring heat from the fourth surface;

the electrically conductive frame is configured to, in operation, transfer heat from the second surface of the first chip and transfer heat from the third surface of the second chip.

18. The power supply module of claim 17, wherein:

the first substrate component includes:

a first positioning recess that receives the first positioning member; and a second positioning recess that receives the second positioning member;

a second substrate component includes:

a third positioning recess that receives the third positioning member; and a fourth positioning recess that receives the fourth positioning member.

19. The power supply module of claim 17, further comprising:

a third chip electrically coupled to the electrically conductive frame of the chip interconnect component on a same side as the first chip or the second chip, wherein the first substrate component or the second substrate component is in contact with the third chip and is configured to conduct heat from the third chip.

20. The power supply module of claim 16, wherein the insulating material is at least one of polyimide, polymethacrylimide, or epoxy resin.

* * * * *